United States Patent
Jeddeloh

(10) Patent No.: US 10,892,003 B2
(45) Date of Patent: *Jan. 12, 2021

(54) MULTI-MODE MEMORY DEVICE AND METHOD HAVING STACKED MEMORY DICE, A LOGIC DIE AND A COMMAND PROCESSING CIRCUIT AND OPERATING IN DIRECT AND INDIRECT MODES

(71) Applicant: MICRON TECHNOLOGY, INC., Boise, ID (US)

(72) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 59 days.

This patent is subject to a terminal disclaimer.

(21) Appl. No.: 16/116,751

(22) Filed: Aug. 29, 2018

(65) Prior Publication Data

US 2018/0374530 A1 Dec. 27, 2018

Related U.S. Application Data

(63) Continuation of application No. 15/597,033, filed on May 16, 2017, now Pat. No. 10,109,343, which is a (Continued)

(51) Int. Cl.
*G11C 11/408* (2006.01)
*G11C 5/02* (2006.01)
(Continued)

(52) U.S. Cl.
CPC ........ *G11C 11/408* (2013.01); *G06F 13/1694* (2013.01); *G11C 5/02* (2013.01); *G11C 11/4093* (2013.01); *G11C 11/4096* (2013.01)

(58) Field of Classification Search
CPC ............. G11C 11/408; G11C 11/4096; G11C 11/4093; G11C 5/02; G06F 13/1694
(Continued)

(56) References Cited

U.S. PATENT DOCUMENTS 3,755,689 A    8/1973   Elmer et al.
5,179,303 A    1/1993   Searles et al.
(Continued)

FOREIGN PATENT DOCUMENTS

CN     101036131 A     9/2007
JP      05-265872       10/1993
(Continued)

OTHER PUBLICATIONS

Notice of Preliminary Rejection dated Mar. 21, 2013 for KR Appln No. 10-2011-7002671.
(Continued)

*Primary Examiner* — Hong C Kim
(74) *Attorney, Agent, or Firm* — Dorsey & Whitney LLP

(57) ABSTRACT

Memory device systems, systems and methods are disclosed, such as those involving a plurality of stacked memory device dice and a logic die connected to each other through a plurality of conductors. The logic die serves, for example, as a memory interface device to a memory access device, such as a processor. The logic die can include a command register that allows selective operation in either of two modes. In a direct mode, conventional command signals as well as row and column address signals are applied to the logic die, and the logic die can essentially couple these signals directly to the memory device dice. In an indirect mode, a packet containing a command and a composite address are applied to the logic die, and the logic die can decode the command and composite address to apply con-
(Continued)

ventional command signals as well as row and column address signals to the memory device dice.

20 Claims, 7 Drawing Sheets

Related U.S. Application Data continuation of application No. 13/619,682, filed on Sep. 14, 2012, now Pat. No. 9,659,630, which is a continuation of application No. 12/166,871, filed on Jul. 2, 2008, now Pat. No. 8,289,760.

(51) Int. Cl.
*G11C 11/4093* (2006.01)
*G11C 11/4096* (2006.01)
*G06F 13/16* (2006.01)

(58) Field of Classification Search
USPC .................. 365/163, 230.03; 711/5, 104
See application file for complete search history.

(56) References Cited

U.S. PATENT DOCUMENTS

| | | |
|---|---|---|
| 5,263,032 A | 11/1993 | Porter et al. |
| 5,726,596 A | 3/1998 | Perez |
| 5,748,914 A | 5/1998 | Barth et al. |
| 5,774,475 A | 6/1998 | Qureshi |
| 5,960,008 A | 9/1999 | Osawa et al. |
| 5,982,684 A | 11/1999 | Schwartzlow et al. |
| 6,052,329 A | 4/2000 | Nishino et al. |
| 6,078,536 A | 6/2000 | Moon et al. |
| 6,122,688 A | 9/2000 | Barth et al. |
| 6,177,807 B1 | 1/2001 | Bertin et al. |
| 6,181,616 B1 | 1/2001 | Byrd |
| 6,247,138 B1 | 6/2001 | Tamura et al. |
| 6,285,211 B1 | 9/2001 | Sample |
| 6,329,859 B1 | 12/2001 | Wu |
| 6,363,017 B2 | 3/2002 | Polney |
| 6,369,627 B1 | 4/2002 | Tomita |
| 6,380,783 B1 | 4/2002 | Chao et al. |
| 6,401,213 B1 | 6/2002 | Jeddeloh |
| 6,418,068 B1 | 7/2002 | Raynham |
| 6,519,194 B2 | 2/2003 | Tsujino et al. |
| 6,570,425 B2 | 5/2003 | Yamaguchi |
| 6,574,626 B1 | 6/2003 | Regelman et al. |
| 6,650,157 B2 | 11/2003 | Amick et al. |
| 6,658,523 B2 | 12/2003 | Janzen et al. |
| 6,727,831 B2 * | 4/2004 | Iwata .................. G06F 1/22 326/93 |
| 6,795,369 B2 | 9/2004 | Choi et al. |
| 6,839,260 B2 | 1/2005 | Ishii |
| 6,882,304 B2 | 4/2005 | Winter et al. |
| 6,889,334 B1 | 5/2005 | Magro et al. |
| 6,907,555 B1 | 6/2005 | Nomura et al. |
| 7,058,865 B2 | 6/2006 | Mori et al. |
| 7,107,424 B1 | 9/2006 | Avakian et al. |
| 7,135,905 B2 | 11/2006 | Teo et al. |
| 7,149,134 B2 | 12/2006 | Streif et al. |
| 7,168,005 B2 | 1/2007 | Adams et al. |
| 7,171,596 B2 | 1/2007 | Boehler |
| 7,184,916 B2 | 2/2007 | Resnick et al. |
| 7,197,101 B2 | 3/2007 | Glenn et al. |
| 7,203,259 B2 | 4/2007 | Glenn et al. |
| 7,205,811 B2 | 4/2007 | Freyman et al. |
| 7,243,469 B2 | 7/2007 | Miller et al. |
| 7,269,094 B2 | 9/2007 | Lin et al. |
| 7,323,917 B2 | 1/2008 | Cho et al. |
| 7,389,375 B2 | 6/2008 | Gower et al. |
| 7,423,469 B2 | 9/2008 | Pickering et al. |
| 7,464,241 B2 | 12/2008 | Pete |
| 7,466,179 B2 | 12/2008 | Huang et al. |
| 7,489,743 B2 | 2/2009 | Koh et al. |
| 7,567,476 B2 | 7/2009 | Ishikawa |
| 7,697,369 B2 | 4/2010 | Koshizuka |
| 7,710,144 B2 | 5/2010 | Dreps et al. |
| 7,764,564 B2 | 7/2010 | Saito et al. |
| 7,772,907 B2 | 8/2010 | Kim et al. |
| 7,853,836 B2 | 12/2010 | Takada |
| 7,855,931 B2 | 12/2010 | LaBerge et al. |
| 7,978,721 B2 | 7/2011 | Jeddeloh et al. |
| 7,979,757 B2 | 7/2011 | Jeddeloh |
| 8,010,866 B2 | 8/2011 | LaBerge |
| 8,127,204 B2 | 2/2012 | Hargan |
| 8,134,876 B2 | 3/2012 | Choi et al. |
| 8,248,138 B2 | 8/2012 | Liu |
| 8,289,760 B2 | 10/2012 | Jeddeloh |
| 8,315,347 B2 | 11/2012 | Canagasaby et al. |
| 8,356,138 B1 | 1/2013 | Kulkami et al. |
| 8,400,808 B2 | 3/2013 | King |
| 8,533,416 B2 | 9/2013 | LaBerge et al. |
| 8,570,881 B2 | 10/2013 | Talbot et al. |
| 8,793,460 B2 | 7/2014 | LaBerge et al. |
| 8,806,131 B2 | 8/2014 | Jeddeloh et al. |
| 9,146,811 B2 | 9/2015 | LaBerge et al. |
| 9,171,597 B2 | 10/2015 | Eckel |
| 9,275,698 B2 | 3/2016 | Laberge et al. |
| 9,411,538 B2 | 8/2016 | LaBerge et al. |
| 9,437,263 B2 | 9/2016 | Eckel |
| 9,524,254 B2 | 12/2016 | Jeddeloh et al. |
| 9,602,080 B2 | 3/2017 | King et al. |
| 9,659,630 B2 * | 5/2017 | Jeddeloh .................. G11C 5/02 |
| 9,899,994 B2 | 2/2018 | King |
| 10,109,343 B2 * | 10/2018 | Jeddeloh .................. G11C 5/02 |
| 2001/0033030 A1 | 10/2001 | Leedy |
| 2002/0004893 A1 | 1/2002 | Chang |
| 2002/0054516 A1 | 5/2002 | Taruishi et al. |
| 2002/0097613 A1 | 7/2002 | Raynham |
| 2002/0125933 A1 | 9/2002 | Tamura et al. |
| 2002/0130687 A1 | 9/2002 | Duesman |
| 2002/0133666 A1 | 9/2002 | Janzen et al. |
| 2002/0138688 A1 | 9/2002 | Hsu et al. |
| 2003/0041299 A1 | 2/2003 | Kanazawa et al. |
| 2003/0132790 A1 | 7/2003 | Amick et al. |
| 2004/0073767 A1 | 4/2004 | Johnson et al. |
| 2004/0098545 A1 | 5/2004 | Pline et al. |
| 2004/0160833 A1 | 8/2004 | Suzuki |
| 2004/0168101 A1 | 8/2004 | Kubo |
| 2004/0199840 A1 | 10/2004 | Takeoka et al. |
| 2004/0206982 A1 | 10/2004 | Lee et al. |
| 2004/0225856 A1 | 11/2004 | Braun et al. |
| 2004/0237023 A1 | 11/2004 | Takahashi et al. |
| 2004/0246026 A1 | 12/2004 | Wang et al. |
| 2004/0252689 A1 * | 12/2004 | Park ..................... G11C 7/10 370/389 |
| 2005/0005230 A1 | 1/2005 | Koga et al. |
| 2005/0071707 A1 | 3/2005 | Hampel |
| 2005/0091471 A1 | 4/2005 | Conner et al. |
| 2005/0144546 A1 | 6/2005 | Igeta et al. |
| 2005/0157560 A1 | 7/2005 | Hosono et al. |
| 2005/0174877 A1 | 8/2005 | Cho et al. |
| 2005/0278490 A1 | 12/2005 | Murayama |
| 2005/0289435 A1 | 12/2005 | Mulla et al. |
| 2006/0028864 A1 | 2/2006 | Rinerson et al. |
| 2006/0036827 A1 | 2/2006 | Dell et al. |
| 2006/0041799 A1 | 2/2006 | Sato |
| 2006/0056247 A1 | 3/2006 | Satoh |
| 2006/0059406 A1 | 3/2006 | Micheloni et al. |
| 2006/0123320 A1 | 6/2006 | Vogt |
| 2006/0126369 A1 * | 6/2006 | Raghuram .......... H01L 25/0657 365/51 |
| 2006/0168101 A1 | 7/2006 | Mikhailov et al. |
| 2006/0223012 A1 | 10/2006 | Sekiguchi et al. |
| 2006/0233012 A1 | 10/2006 | Sekiguchi et al. |
| 2006/0245291 A1 | 11/2006 | Sakaitani |
| 2006/0253723 A1 | 11/2006 | Wu et al. |
| 2006/0262587 A1 | 11/2006 | Matsui et al. |
| 2006/0273455 A1 | 12/2006 | Williams et al. |
| 2006/0282578 A1 | 12/2006 | Lee |
| 2007/0058410 A1 | 3/2007 | Rajan |
| 2007/0070669 A1 | 3/2007 | Tsern |
| 2007/0074093 A1 | 3/2007 | Lasser |

(56) References Cited

U.S. PATENT DOCUMENTS

| | | |
|---|---|---|
| 2007/0096875 A1 | 5/2007 | Waterhouse et al. |
| 2007/0136645 A1 | 6/2007 | Hsueh et al. |
| 2007/0153951 A1 | 7/2007 | Lim et al. |
| 2007/0182471 A1 | 8/2007 | Kim |
| 2007/0210841 A1 | 9/2007 | Kim |
| 2007/0271424 A1 | 11/2007 | Lee et al. |
| 2007/0288707 A1 | 12/2007 | Tremaine |
| 2008/0080261 A1 | 4/2008 | Shaeffer et al. |
| 2008/0147897 A1 | 6/2008 | Talbot |
| 2008/0150088 A1 | 6/2008 | Reed et al. |
| 2008/0201548 A1 | 8/2008 | Przybylski et al. |
| 2008/0250292 A1 | 10/2008 | Djordjevic |
| 2008/0270842 A1 | 10/2008 | Ho et al. |
| 2009/0006775 A1 | 1/2009 | Bartley et al. |
| 2009/0016130 A1 | 1/2009 | Menke et al. |
| 2009/0021992 A1 | 1/2009 | Oh |
| 2009/0091968 A1 | 4/2009 | Dietrich et al. |
| 2009/0196093 A1 * | 8/2009 | Happ ..................... G11C 5/02 365/163 |
| 2009/0244997 A1 | 10/2009 | Searles et al. |
| 2009/0251189 A1 | 10/2009 | Hsieh |
| 2009/0296867 A1 | 12/2009 | Do et al. |
| 2009/0300314 A1 | 12/2009 | Laberge et al. |
| 2009/0300444 A1 | 12/2009 | Jeddeloh |
| 2010/0005217 A1 | 1/2010 | Jeddeloh |
| 2010/0005376 A1 | 1/2010 | Laberge et al. |
| 2010/0014364 A1 | 1/2010 | Laberge et al. |
| 2010/0031129 A1 | 2/2010 | Hargan |
| 2010/0042889 A1 | 2/2010 | Hargan |
| 2010/0070696 A1 | 3/2010 | Blankenship |
| 2010/0079180 A1 | 4/2010 | Kim et al. |
| 2010/0091537 A1 | 4/2010 | Best et al. |
| 2010/0110748 A1 | 5/2010 | Best |
| 2010/0156488 A1 | 6/2010 | Kim et al. |
| 2010/0176893 A1 | 7/2010 | Nose |
| 2010/0271092 A1 | 10/2010 | Zerbe et al. |
| 2010/0308880 A1 | 12/2010 | Nose et al. |
| 2011/0075497 A1 | 3/2011 | Laberge |
| 2011/0148486 A1 | 6/2011 | Mosalikanti et al. |
| 2011/0271158 A1 | 11/2011 | Jeddeloh |
| 2011/0296227 A1 | 12/2011 | LaBerge et al. |
| 2012/0144276 A1 | 6/2012 | Hargan |
| 2012/0155142 A1 | 6/2012 | King |
| 2013/0208549 A1 | 8/2013 | King |
| 2013/0318298 A1 | 11/2013 | LaBerge et al. |
| 2013/0346722 A1 | 12/2013 | LaBerge et al. |
| 2014/0050034 A1 | 2/2014 | Lee |
| 2014/0053040 A1 | 2/2014 | Hargan |
| 2014/0258666 A1 | 9/2014 | LaBerge |
| 2014/0298119 A1 | 10/2014 | LaBerge et al. |
| 2014/0337570 A1 | 11/2014 | LaBerge et al. |
| 2015/0028928 A1 | 1/2015 | King |
| 2015/0063043 A1 | 3/2015 | Eckel |
| 2015/0364172 A1 | 12/2015 | Shim et al. |
| 2016/0027486 A1 | 1/2016 | Eckel |
| 2016/0079971 A1 | 3/2016 | Singh et al. |
| 2016/0133336 A1 | 5/2016 | Lim |
| 2016/0182063 A1 | 6/2016 | Seo et al. |
| 2016/0211011 A1 | 7/2016 | Qian |
| 2017/0163251 A1 | 6/2017 | King |
| 2017/0249984 A1 | 8/2017 | Jeddeloh |

FOREIGN PATENT DOCUMENTS

| | | |
|---|---|---|
| JP | 0774620 A | 3/1995 |
| JP | 11-102599 | 4/1999 |
| JP | 11-513830 | 11/1999 |
| JP | 2003-303139 | 10/2003 |
| JP | 2004-327474 | 11/2004 |
| JP | 2005-4947 | 1/2005 |
| JP | 2007-507794 | 3/2007 |
| JP | 2007-140948 | 6/2007 |
| JP | 2007-226876 | 9/2007 |
| JP | 2007-328636 | 12/2007 |
| JP | 2008-112503 | 5/2008 |
| JP | 2008-140220 | 6/2008 |
| JP | 2010-514080 | 4/2010 |
| WO | 97/14289 | 4/1997 |
| WO | 2005/033958 | 4/2005 |
| WO | 2007028109 A2 | 3/2007 |
| WO | 2007/038225 A2 | 4/2007 |
| WO | 2007/095080 A2 | 8/2007 |
| WO | 2008/054696 A1 | 5/2008 |
| WO | 2008/076790 A2 | 6/2008 |
| WO | 2009/148863 A2 | 12/2009 |
| WO | 2010002561 A2 | 1/2010 |
| WO | 2010011503 A2 | 1/2010 |
| WO | 2012/060097 A1 | 5/2012 |
| WO | 2012/082338 A3 | 6/2012 |

OTHER PUBLICATIONS

Office action recieved for Chinese application No. 200980125792.2 dated Nov. 2, 2012.
Received Office Action dated Nov. 6, 2012 for JP Application No. 2011-516419.
Related U.S. Appl. No. 12/970,086, filed Dec. 16, 2010, entitled Phase Interpolators and Push-Pull Buffers.
2nd Office Action for CN Application 200980125792.2 dated Aug. 29, 2013.
Decision of Rejection for Appl No. 2011-516419 dated Jul. 16, 2013, Jul. 16, 2013.
Extended Search Report for Appl No. 13157772.8 dated Jun. 28, 2013.
International Search Report and Written Opinion dated Feb. 18, 2010 for PCT/US2009/046898.
Notice of Preliminary Rejection for KR Appl# 1020117002671, dated Sep. 24, 2012.
Preliminary Rejection for KR Appl No. 10-2011-7002671 dated Nov. 28, 2013.
TW 1st Office Action for Appl No. 096120886 dated Apr. 24, 2013.
Extended European Search Report dated Aug. 29, 2011 for European Application No. 09774012.0.

* cited by examiner

| FIELD | BITS | COMMENT |
|---|---|---|
| CMD | 4 | COMMAND FIELD<br><br>0000 NOP<br>0001 CMD EXT1 - READ<br>0010 CMD EXT2 - RESERVED<br>0011 CMD EXT3 - RESERVED<br>0100 CMD EXT4 - WRITE<br>0101 CMD EXT5 - MASKED WRITE<br>0110 CMD EXT6 - RESERVED<br>0111 CMD EXT7 - RESERVED<br><br>1000-1111 - RESERVED |
| UAddress | 28 | UPPER ADDRESS - 36 BITS SUPPORTS 64GBytes PER STACK, MAXIMUM 8 64Gbit DRAM |
| LAddress | 5 | LOWER ADDRESS |
| CMD EXT | 3 | COMMAND EXTENSION<br><br><u>CMD EXT1 - DECODE READ</u><br>000 RESERVED<br>001 RESERVED<br>010 RESERVED<br>011 READ 8 BYTE<br>010 READ 16 BYTE<br>010 READ 32 BYTE<br>011 READ 64 BYTE<br>111 READ 128 BYTE<br><br><u>CMD EXT4 - WRITE</u><br>000 RESERVED<br>001 RESERVED<br>010 RESERVED<br>011 WRITE 8 BYTE<br>010 WRITE 16 BYTE<br>010 WRITE 32 BYTE<br>011 WRITE 64 BYTE<br>111 WRITE 128 BYTE<br><br><u>CMD EXT5 - MASKED WRITE</u><br>000 RESERVED<br>001 RESERVED<br>010 RESERVED<br>011 MASKED WRITE 8 BYTE<br>010 MASKED WRITE 16 BYTE<br>010 MASKED WRITE 32 BYTE<br>011 MASKED WRITE 64 BYTE<br>111 MASKED WRITE 128 BYTE |
| RSV0 | 2 | RESERVED |
| HCRC | 6 | HEADER CRC (CRC-6) - DETECTS A SINGLE LANE FAILURE |
| TAG | 8 | SUPPORTS UP TO 256 OUTSTANDING READS AND OUTSTANDING WRITES |

FIGURE 6

MULTI-MODE MEMORY DEVICE AND METHOD HAVING STACKED MEMORY DICE, A LOGIC DIE AND A COMMAND PROCESSING CIRCUIT AND OPERATING IN DIRECT AND INDIRECT MODES

CROSS-REFERENCE TO RELATED APPLICATIONS

This application is a continuation of U.S. patent application Ser. No. 15/597,033, filed May 16, 2017, and issued as U.S. Pat. No. 10,109,343 on Oct. 23, 2018, which is a continuation of U.S. patent application Ser. No. 13/619,682, filed Sep. 14, 2012, and issued as U.S. Pat. No. 9,659,630 on May 23, 2017, which is a continuation of U.S. patent application Ser. No. 12/166,871, filed Jul. 2, 2008, issued as U.S. Pat. No. 8,289,760 on Oct. 16, 2012. The aforementioned applications and patents are incorporated by reference herein, in their entirety, and for all purposes.

TECHNICAL FIELD

Embodiments of the invention relate to memory devices, and, more particularly, in one or more embodiments to a memory device that can be operated in either a direct mode, in which conventional memory control signals are coupled to the memory devices, or an indirect mode, in which command packets are coupled to the memory devices.

BACKGROUND OF THE INVENTION

As memory devices of all types have evolved, continuous strides have been made in improving their performance in a variety of respects. For example, the storage capacity of memory devices has continued to increase at geometric proportions. This increased capacity, coupled with the geometrically higher operating speeds of electronic systems containing memory devices, has made high memory device bandwidth ever more critical. One application in which memory devices, such as dynamic random access memory ("DRAM") devices, require a higher bandwidth is their use as system memory in computer systems. As the operating speed of processors has increased, processors are able to read and write data at correspondingly higher speeds. Yet conventional DRAM devices often do not have the bandwidth to read and write data at these higher speeds, thereby slowing the performance of conventional computer systems. This problem is exacerbated by the trend toward multi-core processors and multiple processor computer systems. It is currently estimated that computer systems operating as high-end servers are idle as many as 3 out of every 4 clock cycles because of the limited data bandwidth of system memory devices. In fact, the limited bandwidth of DRAM devices operating as system memory can reduce the performance of computer systems to as low as 10% of the performance of which they would otherwise be capable.

Various attempts have been made to increase the data bandwidth of memory devices. For example, wider internal data buses have been used to transfer data to and from arrays with a higher bandwidth. However, doing so usually requires that write data be serialized and read data deserialized at the memory device interface. Another approach has been to simply scale up the size of memory devices or conversely shrink their feature sizes, but, for a variety of reasons, scaling has been incapable of keeping up with the geometric increase in the demand for higher data bandwidths.

More recently, proposals have also been made to stack several integrated circuit memory devices in the same package, but doing so threatens to create a large number of other problems to be overcome. These problems can be solved to a large extent by connecting the stack of interconnected memory devices to a logic die on which the memory devices are stacked. The logic die can then serve as a high-speed interface to the memory devices. However, taking advantage of the increased capabilities of this arrangement is more easily achieved if memory command and address signals are placed in a packet and coupled to the logic die through a high-speed bus. Yet many computer and other systems are designed to interface with memory devices using conventional memory command signals and conventional row and column address signals. Advanced memory systems formed by stacking memory devices on a logic die would therefore be unusable with such systems. However, memory device manufacturers generally desire to standardize their product offerings to the greatest extent possible to lessen the number of different memory devices that are manufactured, marketed, etc.

Therefore, a need exists for a method and system to allow advanced memory system formed by stacking interconnected memory device dice to be interfaced with systems by either using conventional memory commands and addresses or by using packets containing commands and addresses.

BRIEF DESCRIPTION OF THE DRAWINGS

FIG. 6 is a chart showing the commands in the downstream packet of FIG. 4 for the indirect operating mode.

DETAILED DESCRIPTION

Figure 1:
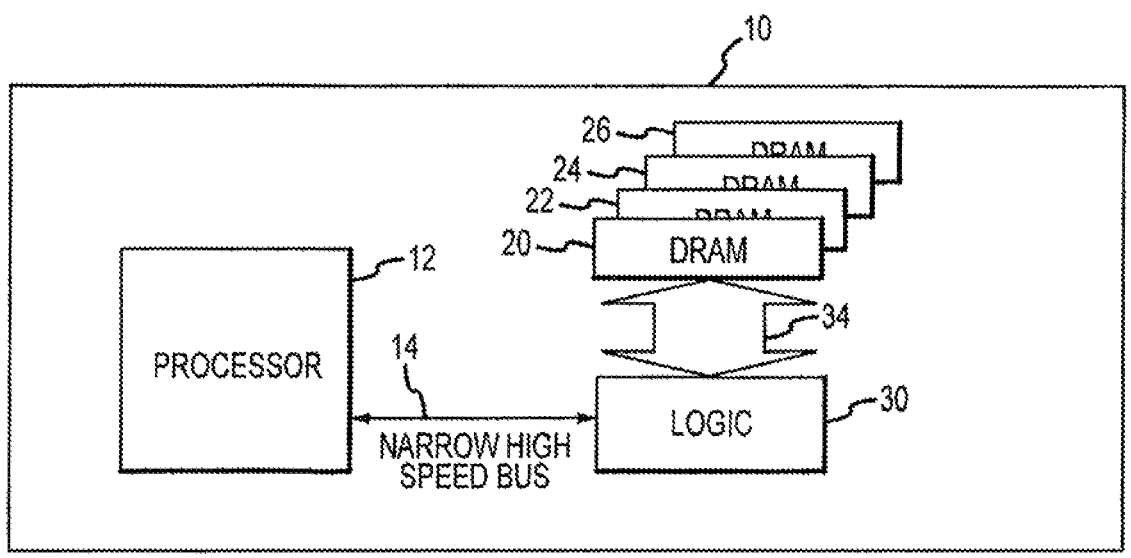
FIG. 1 is a block diagram of a computer system that includes a dual mode memory system according to an embodiment of the invention.

A computer system including a high-capacity, high bandwidth memory device 10 according to an embodiment of the invention is shown in FIG. 1 connected to a processor 12 through a relatively narrow high-speed bus 14 that may be divided into downstream lanes and separate upstream lanes (not shown in FIG. 1). The memory device 10 includes 4 DRAM die 20, 22, 24, 26, which may be identical to each other, stacked on top of each other. Although the memory device 10 includes 4 DRAM die 20, 22, 24, 26, other embodiments of the memory device use a greater or lesser number of DRAM die. The DRAM die 20, 22, 24, 26 are stacked with (e.g., on top of) a logic die 30, which serves as the interface with the processor 12. The logic die 30 can implement a variety of functions in the memory device 10, such as to limit the number of functions that are be implemented in the DRAM die 20, 22, 24, 26. For example, the logic die 30 may perform memory management functions, such as power management and refresh of memory cells in the DRAM die 20, 22, 24, 26. In some embodiments, the logic die 30 may implement test and/or repair capabilities, and it may perform error checking and correcting ("ECC") functions.

The DRAM die 20, 22, 24, 26 are connected to each other and to the logic die 30 by a relatively wide bus 34. The bus 34 may be implemented with through silicon vias ("TSVs"), which comprise a large number of conductors extending through the DRAM die 20, 22, 24, 26 at the same locations on the DRAM die and connect to respective conductors formed on the die 20, 22, 24, 26. In one embodiment, each of the DRAM die 20, 22, 24, 26 are divided into 16 autonomous partitions, each of which may contain 2 or 4 independent memory banks. In such case, the partitions of each die 20, 22, 24, 26 that are stacked on top of each other may be independently accessed for read and write operations. Each set of 16 stacked partitions may be referred to as a "vault." Thus, the memory device 10 may contain 16 vaults.

Figure 2:
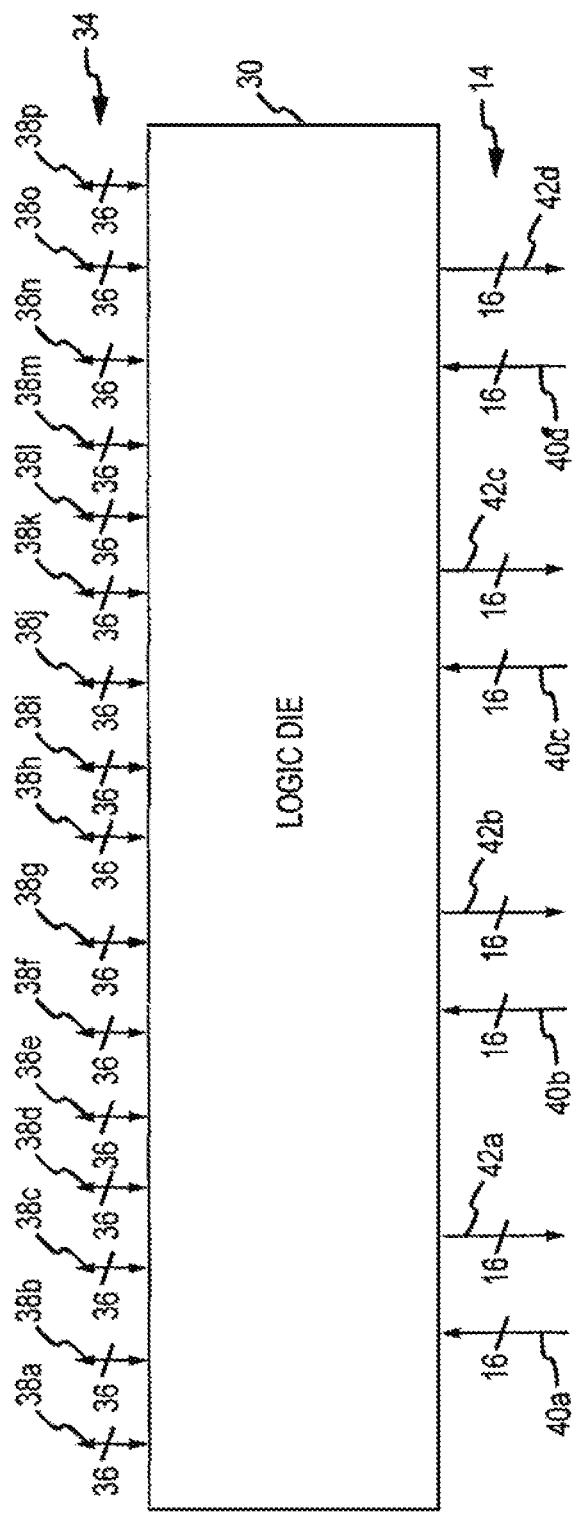
FIG. 2 is a block diagram of a dual mode memory system according to an embodiment of the invention.

As shown in FIG. 2, in one embodiment, the bus 34 may be divided into 16 36-bit bi-directional sub-buses 38a-p, with each of the 16 36-bit sub-buses coupled to the 4 partitions in a respective vault. Each of these sub-buses couples 32 bits of a data and 4 ECC bits between the logic die 30 and the DRAM die 20, 22, 24, 26. However, the number of stacked DRAM die 20, 22, 24, 26, the number of partitions in each DRAM die, the number of banks in each partition, and the number of bits in each of the sub-buses 38a-p can vary as desired. The relatively narrow high-speed bus 14 connecting the processor 12 to the logic die may be divided into 4 16-bit downstream lanes 40a-d and 4 separate 16-bit upstream lanes 42a-d. The 4 downstream lanes 40a-d may be connected to a single processor 12 as shown in FIG. 1, which may be a multi-core processor, to multiple processors (not shown), or to some other memory access device like a memory controller. The 4 downstream lanes 40a-d may operate independently of each other so that packets (in the indirect mode) or memory command, address, and data signals (in the direct mode) are coupled through the lanes 40a-d at different times and to the same or different vaults.

As explained in greater detail below, one of the functions performed by the logic die 30 can be to serialize the read data bits coupled from the DRAM die 20, 22, 24, 26 into a serial stream of 16 serial data bits coupled through 16 parallel bits of each upstream lane 42a-d of the bus 14. Similarly, the logic die 30 may perform the functions of deserializing 16 serial data bits coupled through one of the 16-bit downstream lanes 40a-d of the bus 14 to obtain 256 parallel data bits. The logic die 30 then couples these 256 bits through one of the 32-bit sub-buses 38a-p in a serial stream of 8 bits. However, other embodiments may use different numbers of lanes 40, 42 having different widths or different numbers of sub-buses 38a-p having different widths, and they may couple data bits having different structures. As will be appreciated by one skilled in the art, the stacking of multiple DRAM die results in a memory device having a very large capacity. Further, the use of a very wide bus connecting the DRAM die allows data to be coupled to and from the DRAM die with a very high bandwidth.

Figure 3:
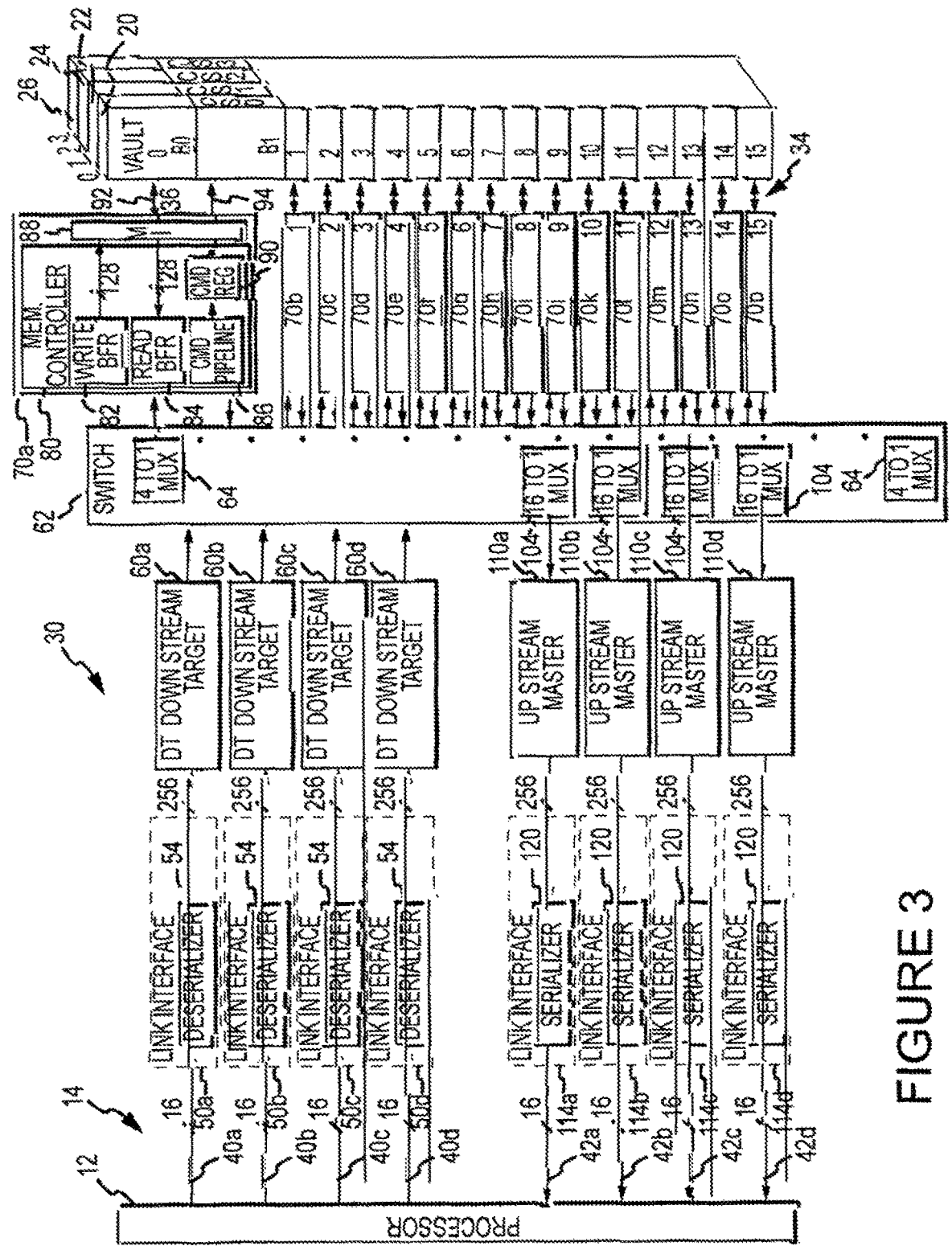
FIG. 3 is a more detailed block diagram of a dual mode memory system according to an embodiment of the invention.

A logic die 30 according to an embodiment of the invention is shown in FIG. 3 connected to the processor 12 and the DRAM die 20, 22, 24, 26. As shown in FIG. 3, each of the 4 downstream lanes 40a-d may be connected to a respective link interface 50a-d. Each link interface 50a-d includes a deserializer 54 that converts each serial stream of 16 data bits on each of the 16-bit lanes 40a-d to 256 parallel bits. Insofar as there are 4 link interfaces 50a-d, the link interfaces can together output 1024 output parallel bits.

Each of the link interfaces 50a-d applies its 256 parallel bits to a respective downstream target 60a-d, which decodes the command and address portions of the received packet (in the indirect mode) or the commands and addresses (in the direct mode) and buffers write data in the event a memory request is for a write operation. The downstream targets 60a-d output their respective commands, addresses and possibly write data to a switch 62. The switch 62 contains 16 multiplexers 64 each of which direct the command, addresses and any write data from any of the downstream targets 60a-d to its respective vault of the DRAM die 20, 22, 24, 26. Thus, each of the downstream targets 60a-d can access any of the 16 vaults in the DRAM die 20, 22, 24, 26. The multiplexers 64 use the address in the received memory requests to determine if its respective vault is the target of a memory request. Each of the multiplexers 64 apply the memory request to a respective one of 16 vault controllers 70a-p.

Each vault controller 70a-p includes a respective memory controller 80, each of which includes a write buffer 82, a read buffer 84 and a command pipeline 86. The commands and addresses in memory requests received from the switch 62 are loaded into the command pipeline 86, which subsequently outputs the received commands and corresponding addresses. Any write data in the memory requests are stored in the write buffer 82. The read buffer 84 may be used to store read data from the respective vault, as will be explained in greater detail below. The write data from the write buffer 82 are applied to a memory interface 88.

According to an embodiment of the invention, the commands and addresses from the command pipeline 86 are applied to a memory interface 88 through a command processing circuit, such as a command register 90. The command register 90 can be a free running interface register. In the direct mode, the commands and addresses from the command pipeline are applied to the memory interface 88. These commands and addressed may be applied to the memory interface 88 as they are received by the memory device 10. In the indirect mode, the command register 90 creates the commands and addresses and sends it to the memory interface 88. The command register 90 includes a sequencer (not shown) that transmits the commands and addresses to the memory interface in the proper order and at the proper times.

The memory interface 88 couples the received command and address signals from the command register 90 to the DRAM die 20, 22, 24, 26 through a command/address bus 92. The memory interface 88 also couples 32-bits of write data from the write buffer 82. In some embodiments, the memory interface 88 may include an ECC system (not shown), which uses ECC techniques to check and correct the data read from the DRAM die 20, 22, 24, 26. In such case, in addition to coupling write data to the DRAM die 20, 22, 24, 26, the memory interface 88 couples 4 bits of ECC from the ECC system to the DRAM die 20, 22, 24, 26 through a 36-bit data bus 94.

Although write data are loaded into the write buffer 82 as 256 parallel bits, they are output from the buffer 82 in two sets, each set being 128 parallel bits. These 128 bits may then be further serialized by the ECC system (not shown) to 4 sets of 32-bit data, which are coupled through the data bus 94. In the embodiment shown in FIG. 3, write data are coupled to the write buffer 82 in synchronism with a 500 MHz clock so the data are stored in the write buffer at 16 gigabytes ("GB") per second. The write data are coupled from the write buffer 82 to the DRAM die 20, 22, 24, 26 using a 2 GHz clock so the data are output from the write buffer 82 at 8 GB/s. Therefore, as long as more than half of the memory requests are not write operations to the same vault, the write buffers 82 will be able to couple the write data to the DRAM die 20, 22, 24, 26 at least as fast as the data are coupled to the write buffer 82.

In the event a memory request is for a read operation, the command and address for the request are coupled to the DRAM die 20, 22, 24, 26 in the same manner as a write request, as explained above. In response to a read request, 32 bits of read data and 4 ECC bits are output from the DRAM die 20, 22, 24, 26 through the 36-bit data bus 94. The ECC bits are passed to the ECC system (not shown), which uses the ECC bits to check and correct the read data before passing the read data on to the read buffer 84. The ECC system also deserializes the 32 bits of read data into two sets of 128-bit read data. However, in some embodiments, the memory system does not include the ECC system.

After 2 sets of 128-bit read data have been stored in the read buffer 84, the read buffer transmits 256 bits to the switch 62. The switch includes 4 output multiplexers 104 coupled to respective upstream masters 110a-d. Each multiplexer 104 can couple 256 bits of parallel data from any one of the vault controllers 70a-p to its respective upstream master 110a-d. The upstream masters 110a-d format the 256 bits of read data into packet data (in the indirect mode) and couple the packet to respective upstream link interfaces 114a-d. In the direct mode, the read data are simply coupled to respective upstream link interfaces 114a-d. Each of the link interfaces 114a-d include a respective serializer 120 that converts the incoming 256 bits to a serial stream of 16 bits on each bit of a respective one of the 16-bit upstream links 42a-d.

Figure 4:
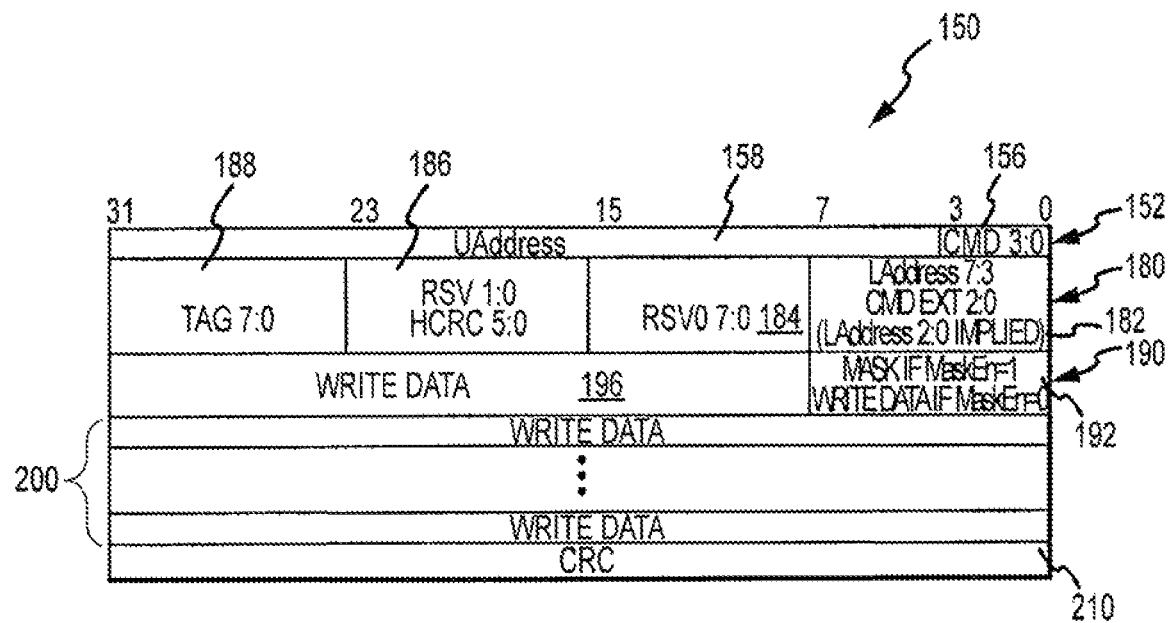
FIG. 4 is a packet diagram showing the format of a downstream packet that can be coupled to the memory system of FIG. 1, 2 or 3 or a memory system according to some other embodiment of the invention for the indirect operating mode.

The format of a downstream packet 150 that can be coupled to the memory system of FIG. 1, 2 or 3 or a memory system according to some other embodiment of the invention is shown in FIG. 4. The downstream packet 150 may be, as explained above, 32 bits wide, and it contains a first field 152. In the indirect operating mode, the first field 152 includes a 4-bit command 156 ("Cmd 3:0"), and 28 bits of an upper address 158 ("UAddress"). The nature of the command 156 and upper address 158 will be described in connection with FIG. 6.

Figure 5:
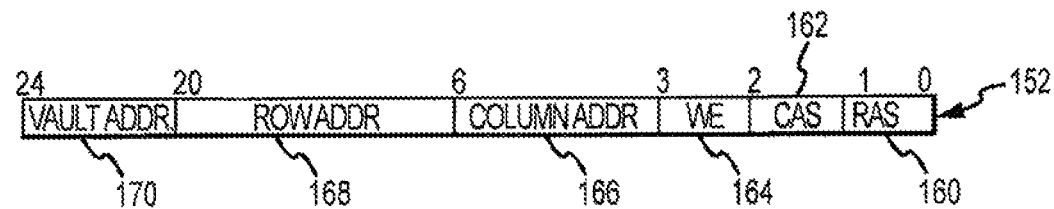
FIG. 5 is a chart showing how the commands in the first field of the downstream packet of FIG. 4 are modified for the direct operating mode.

As shown in FIG. 5, in the direct mode, the first field 152 of the downstream packet 150 may be modified to allow a memory access device to directly access the DRAM die 20, 22, 24, 26. The first bit of the first field 152 may be a row address strobe ("RAS") signal 160, the second bit may be a column address strobe ("CAS") signal 162 and the third bit may be a write enable ("WE") signal 164. The first field 152 also includes a 4-bit column address 166 and a 14-bit row address 168. Finally, the first field 152 includes a four bit vault address 170. The vault address 170 specifies which of the 16 vaults are being accessed.

Returning to FIG. 4, the downstream packet 150 also contains a second field 180, which may be used in the indirect operating mode. The second field 180 contains a first group of 8 bits 182 that include 3-bit command extension ("Cmd Ext") and 5 bits of a lower address ("LAddress"). As subsequently explained, the Cmd Ext bits 182 are used to further define commands designated by the four command bits 156. The next eight bits 184 of the second field 180 are reserved. The next eight bits 186 include 2 reserved bits ("RSV") and 6 header error checking and correcting bits ("HCRC"), which allow errors in the first field 152 to be detected and possibly corrected. A final eight bits 188 of the second field 180 are tag bits ("Tag") which uniquely identifies each memory request. As explained in greater detail below, these Tag bits 188 are included in upstream packets containing read data so that the memory request to which the read data corresponds can be identified, for example. Also, including these Tag bits 188 in an upstream packet for a write allows the writing of data to be acknowledged in an upstream packet, as will be subsequently explained.

The downstream packet 150 also contains a third field 190, which includes a mask bit 192 that specifies whether a write will be masked, and 31 bits of write data 196. Following the third field 190 are one or more fields of write data 200. A final field contains a set of error checking bits 210, which may be cyclic redundancy check ("CRC") bits, ECC bits or some other type of error checking bits. The error checking bits 210 correspond to the write data to allow the memory system to determine if there were any errors in the transmission of the write data. In the case where the error checking bits are ECC bits and the number of errors is not too great, the bits 210 may allow errors in the write data to be corrected.

Potential commands corresponding to the 4 command bits 156 in the first field 152 are shown in FIG. 6 for the indirect mode. For the direct mode, the memory commands are formed by combinations of the WE, CAD and RAS signals shown in FIG. 5. As shown in FIG. 6, Cmd "0000" is for a no operation ("NOP") command, which does not cause the memory system 10 to perform any memory access. The command "0001" is decoded as a read command, with the number of bytes in the read being designated by the command extension bits 182. The command "0100" is decoded as a write command, with the number of bytes being written again by the command extension bits 182. Finally, the command "0101" is decoded as a masked write command, with the number of bytes also being written by the command extension bits 182. The remaining commands in the Cmd bits 156 are reserved for implementing additional functions.

With further reference to FIG. 6, the 28-bit upper address 158 and the 5-bit lower address in the bit group 182 specify the location in the memory system that is the subject of the memory request. The logic die 30 uses these address bits to route a memory request to the corresponding vault and the corresponding row and column address in that vault. As mentioned above, the command extension "Cmd Ext" in the group 182 specifies the number of bytes that are read or written for a read and write or a masked write. If the command 156 in the first field 152 was for a read, the command extensions "011" through "111" designate a read request of 8 through 128 bytes. The remaining command extensions are used for implementing additional functions. If the command 156 in the first field 152 was for a write, the command extensions "011" through "11" similarly designate a write request of 8 through 128 bytes. Finally, if the command 156 in the first field 152 was for a masked write, the command extensions "011" through "111" designate a masked write request of 8 through 128 bytes. The remaining command extensions are used for implementing additional functions.

As also shown in FIG. 6, the 6 error checking bits "HCRC" in the group 186 detects whether the data in the first field 152 contains an error. The final 8-bit tag 188 uniquely identifies each memory request, as previously explained.

Figure 7:
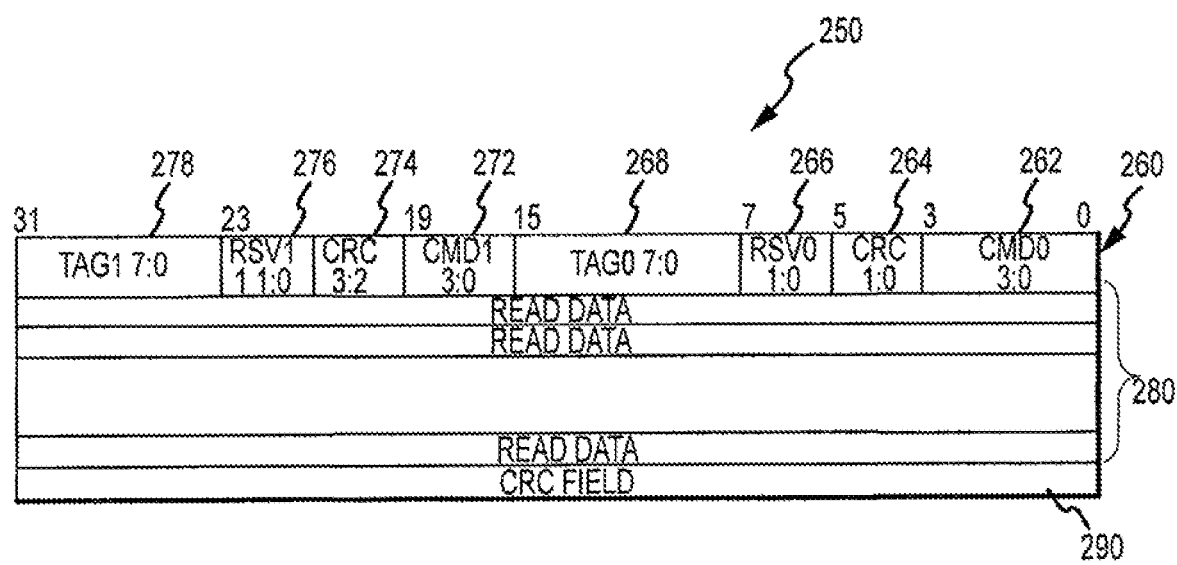
FIG. 7 is a packet diagram showing the format of an upstream packet that can be coupled from the memory system of FIG. 1, 2 or 3 or a memory system according to some other embodiment of the invention.

The format of an upstream packet 250 is shown in FIG. 7. A first field 260 of the upstream packet 250 includes a 4-bit command ("Cmd0") 262, and 2 error checking bits 264. Next are 2 reserved bits 266 followed by the 8-bit tag 268 ("Tag0"), which, as previously explained, corresponds to the tag in the downstream packet 150 to which the read data is responsive. The first field 260 also contains a second set of the above-described bits, namely a 4-bit command ("Cmd1") 272, and 2 error checking bits 274. These error checking bits 274, along with the 2 error checking bits 264, allow detection and possibly correction of errors in the 32 bits of the first field 260. The first field 260 also contains 2 reserved bits 276, and an 8-bit tag 278 ("Tag1"). The upstream packet 250 normally does not include read data for two memory requests. However, the ability to include a second tag 278 and command 272, etc. in the first field 260 allows a write request to be acknowledged in the same upstream packet 250 as an upstream packet containing read data and an associated tag. Following the first field 260 are one or more 32-bit fields 280 of read data and a 32-bit field 290 of error checking bits. These error checking bits allow a memory controller or other memory access device receiving the read data to check for and possibly correct any transmission errors in the read data.

Figure 8:
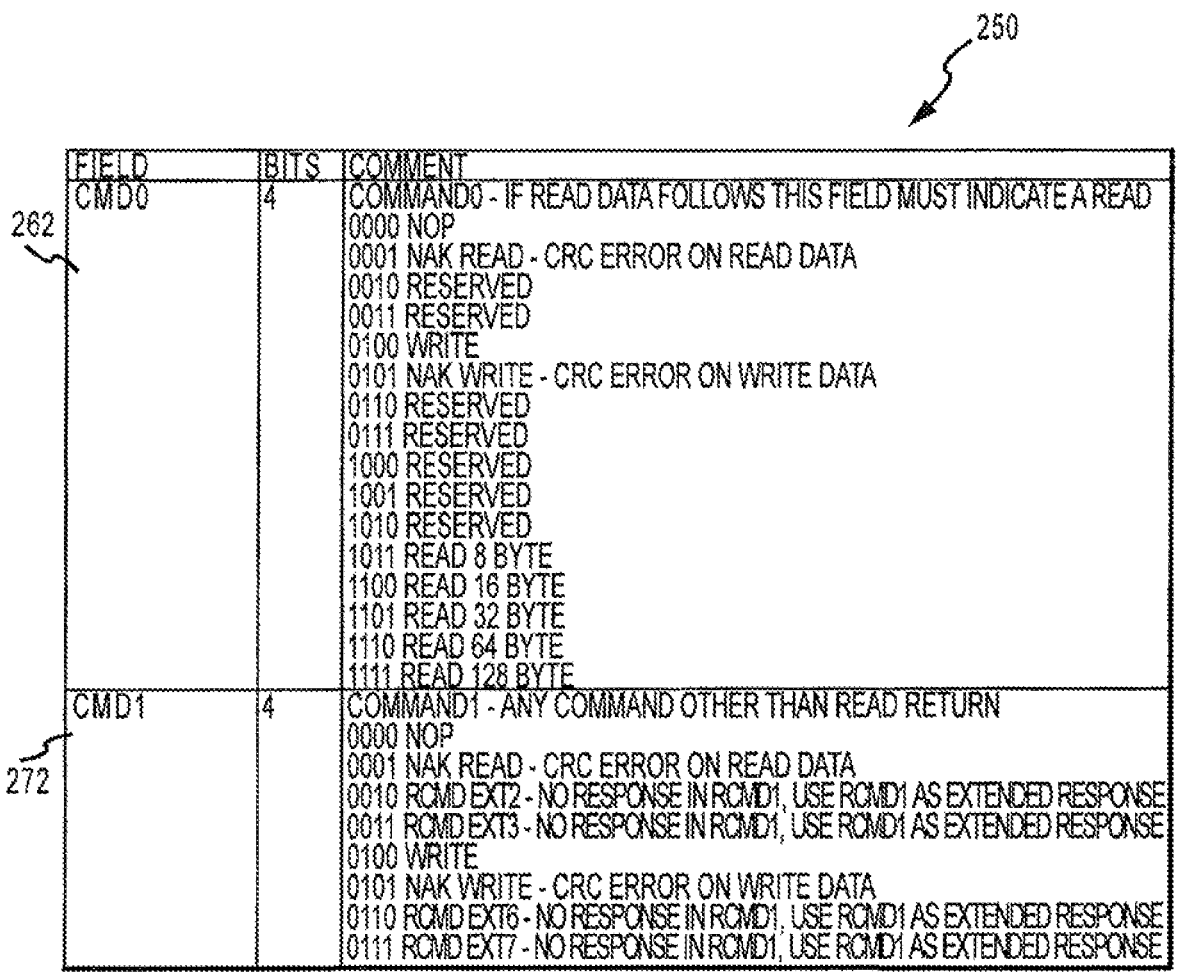
FIG. 8 is a chart showing the commands in the upstream packet of FIG. 7 for the indirect operating mode.

The commands corresponding to the Cmd bits 262, 272 in the upstream packet 250 are shown in FIG. 8. The 4-bit command "Cmd0" 262 corresponds to a read if the upstream packet 250 is to contain read data. Again, the command "0000" is for a no operation "NOP" command. The next command "0001" is a naked command ("NAK") that acknowledges a read memory request but indicates that the data could not be read because of an error. The command "0100" acknowledges a prior write request, and the command "0101" is a naked command that acknowledges a prior write request but indicates that the write data was in error. The commands "1011" through "1111" indicates the upstream packet 250 contains read data of 8, 16, 32, 64 or 128 bytes, respectively. The remaining commands of "Cmd0" are reserved for implementing other features.

The commands corresponding to the Cmd1 bits 272 are also shown in FIG. 8. The command "0000" is again for a no operation "NOP" command, and the command "0001" is again a naked command ("NAK") that acknowledges a read memory request but indicates that the data could not be read because of an error. The command "0100" acknowledges a prior write request, and the command "0101" is a naked command that acknowledges a prior write request but indicates that the write data was in error. The remaining commands of "Cmd1" are reserved for implementing other features.

From the foregoing it will be appreciated that, although specific embodiments of the invention have been described herein for purposes of illustration, various modifications may be made without deviating from the spirit and scope of the invention. For example, although the embodiments of the invention are explained in the context of stacked DRAM die, it will be understood that the stacked die may be other types of memory device dice, such as flash memory device dice. Accordingly, the invention is not limited except as by the appended claims.

The invention claimed is:

1. An apparatus comprising:

a plurality of stacked memory device dice; and a logic die coupled to the plurality of stacked memory device dice, the logic die including a command processing circuit configured to interpret, in a first mode, a position of bits in a received packet as a row address strobe signal and a column address strobe signal, respectively, and, interpret, in a second mode, the position of bits in the received packet as at least a portion of a command code, the logic die further configured to transmit a command to the plurality of memory device dice based on the interpreted position of bits.

2. The apparatus of claim 1, wherein the plurality of memory device dice are operable in the first mode to provide data directly to upstream link interfaces included in the logic die, and wherein the plurality of memory device dice are operable in the second mode to provide data formatted by respective upstream masters included in the logic die to the upstream link interfaces.

3. The apparatus of claim 1, wherein the first mode is a direct mode and the second mode is an indirect mode, wherein the plurality of memory device dice are operable in the direct mode to provide read data directly to upstream link interfaces included in the logic die, and wherein the plurality of memory device dice are operable in the indirect mode to provide read data formatted by respective upstream masters included in the logic die to the upstream link interfaces.

4. The apparatus of claim 1, wherein the command processing circuit is configured to interpret, in the first mode, the position of bits in the received packet as the row address strobe signal, the column address strobe signal, and a write enable signal, respectively.

5. The apparatus of claim 1, wherein the first mode is a direct mode, and wherein the command processing circuit configured to interpret, in the direct mode, the position of bits in the received packet as the row address strobe signal, the column address strobe signal, and a write enable signal, respectively.

6. A method comprising:

receiving, by a command processing circuit of a memory device, a packet including a memory command used to write data to or read data from a plurality of stacked memory device dice;

generating and transmitting, to the plurality of stacked memory device dice, a first command based on the received memory command including first and second bits interpreted at a location in the received packet as a row address strobe signal and a column address strobe signal, respectively, responsive to the memory device operable in a first mode; and generating and transmitting, to the plurality of stacked memory device dice, a second command based on the received memory command including first and second bits interpreted at the location in the received packet as at least a portion of a command code, responsive to the memory device operable in a second mode.

7. The method of claim 6, transmitting, by the plurality of stacked memory device dice in the first mode, read data directly to upstream link interfaces of the memory device coupled to the command processing circuit.

8. The method of claim 6, further comprising:

transmitting, by the plurality of stacked memory device dice in the second mode, read data formatted by upstream masters of the memory device to respective upstream link interfaces of the memory device coupled to the upstream masters.

9. The method of claim 6, wherein the first mode is a direct mode and the second mode is an indirect mode.

10. The method of claim 6, wherein a logic die of the memory device including the command processing circuit is operable in the first mode to transmit read data to a memory access device in the same format that the logic die receives the read data from memory device dice, and is operable in the second mode to format the read data received from the memory device dice coupled to the command processing circuit into another packet and to transmit the another packet to the memory access device.

11. A memory device system, comprising:

a plurality of stacked memory device dice;

a logic die coupled to the memory device dice; and a command processing circuit coupled to the logic die and the memory device dice, the command processing circuit operable in a first operating mode to apply commands received in a packet by the memory device dice, the memory device dice operable in the first operating mode to provide data directly to upstream link interfaces included in the logic die, the command processing circuit operable in a second operating mode to generate commands having a format that is different from corresponding commands received in the packet and to couple the generated commands to the memory device dice, the memory device dice operable in the second operating mode to provide read data formatted via respective upstream masters included in the logic die to the upstream link interfaces.

12. The memory device system of claim 11, wherein in the first operating mode commands received in the packet by the memory device dice include a position of bits interpreted as a row address strobe signal and a column address strobe signal.

13. The memory device system of claim 11, wherein in the second operating mode commands received in the packet by the memory device dice include a position of bits interpreted as at least a portion of a command code.

14. The memory device system of claim 11, wherein in the first operating mode commands received in the packet by the memory device dice include a position of bits interpreted as a row address strobe signal and a column address strobe signal, and wherein in the second operating mode commands received in the packet to the memory device dice include the position of bits interpreted as at least a portion of a command code.

15. The memory device system of claim 11, wherein the first mode is a direct mode, and wherein the command processing circuit configured to interpret, in the direct mode, a position of bits in the received packet as a row address strobe signal, a column address strobe signal, and a write enable signal, respectively.

16. A method comprising:

receiving a packet at a logic die of a memory device;

transmitting, from a command processing circuit of the logic die and to a plurality of memory device dice of the memory device operable in a first operating mode, commands received in the packet, the plurality of memory device dice operable in the first operating mode to provide data directly to upstream link interfaces; and transmitting, from a command processing circuit of the logic die and to the plurality of memory device dice of the memory device operable in a second operating mode, generated commands having a format that is different from corresponding commands received in the packet, the plurality of memory device dice operable in the second operating mode to provide data formatted by respective upstream masters to the upstream link interfaces.

17. The method of claim 16, wherein the first operating mode is a direct operating mode and the second operating mode is an indirect operating mode.

18. The method of claim 17, further comprising:

interpreting, by the command processing circuit in the direct operating mode, a position of bits in the packet as a row address strobe signal and a column address strobe signal; and interpreting, by the command processing circuit in the indirect operating mode, the position of bits in the packet as at least a portion of a command code.

19. The method of claim 16, further comprising:

receiving, at the logic die of the memory device, one or more packets including the received packet, and providing, by the command processing circuit in the first operating mode, data corresponding to the one or more packets to the plurality of memory dice based on a preset order.

20. The method of claim 19, wherein, in the second operating mode, the preset order is different from an order of the one or more packets received at the command processing circuit.

* * * * *